United States Patent [19]
Shibue

[11] Patent Number: 5,285,420
[45] Date of Patent: Feb. 8, 1994

[54] SEMICONDUCTOR MEMORY DEVICE HAVING CONCURRENTLY RESETTABLE MEMORY CELLS

[75] Inventor: Yasuo Shibue, Tokyo, Japan

[73] Assignee: NEC Corporation, Tokyo, Japan

[21] Appl. No.: 617,743

[22] Filed: Nov. 26, 1990

[30] Foreign Application Priority Data

Nov. 24, 1989 [JP] Japan .................. 1-305490

[51] Int. Cl.⁵ .................. G11C 7/00; G11C 5/00
[52] U.S. Cl. .................. 365/218; 365/189.04; 365/900
[58] Field of Search .................. 365/218, 189.04, 900

[56] References Cited

U.S. PATENT DOCUMENTS

| | | | |
|---|---|---|---|
| 4,488,264 | 12/1984 | Dshkhunian et al. | 365/189.04 |
| 4,567,578 | 1/1986 | Cohen et al. | 365/189.04 |
| 4,575,823 | 3/1986 | Fitzpatrick | 365/184 |
| 4,805,149 | 2/1989 | Tam et al. | 365/190 |
| 4,805,151 | 2/1989 | Terada et al. | 365/218 |
| 4,879,687 | 11/1989 | Okamoto et al. | 365/218 |
| 4,890,263 | 12/1989 | Little | 365/218 |
| 4,949,308 | 8/1990 | Araki et al. | 365/218 |
| 4,958,317 | 9/1990 | Terada et al. | 365/189.04 |
| 5,054,000 | 10/1991 | Miyaji | 365/218 |
| 5,089,992 | 2/1992 | Shinohara | 365/189.04 |

FOREIGN PATENT DOCUMENTS 0140235 5/1985 European Pat. Off. ........ G11C 7/00
0257938 3/1988 European Pat. Off. ........ G11C 7/00

OTHER PUBLICATIONS

Annex to The European Search Report.

Primary Examiner—Eugene R. LaRoche
Assistant Examiner—Michael C. Kessell
Attorney, Agent, or Firm—Sughrue, Mion, Zinn, Macpeak & Seas

[57] ABSTRACT

A semiconductor memory device comprises a plurality of memory cells having respective memory circuits for storing data bits each being of either logic "1" or logic "0" level in a rewritable manner, a read-out unit operative to selectively read out the data bits from the memory cells, a write-in unit operative to selectively write data bits into the memory cells, and a resetting unit operative to concurrently write reset data bits of a predetermined logic level into the memory cells, wherein the resetting unit comprises switching transistors respectively coupled to the memory circuits and a source of the predetermined logic level and is responsive to an external reset controlling signal for causing the switching transistors to concurrently turn on, thereby concurrently writing the reset data bits without failure.

4 Claims, 9 Drawing Sheets

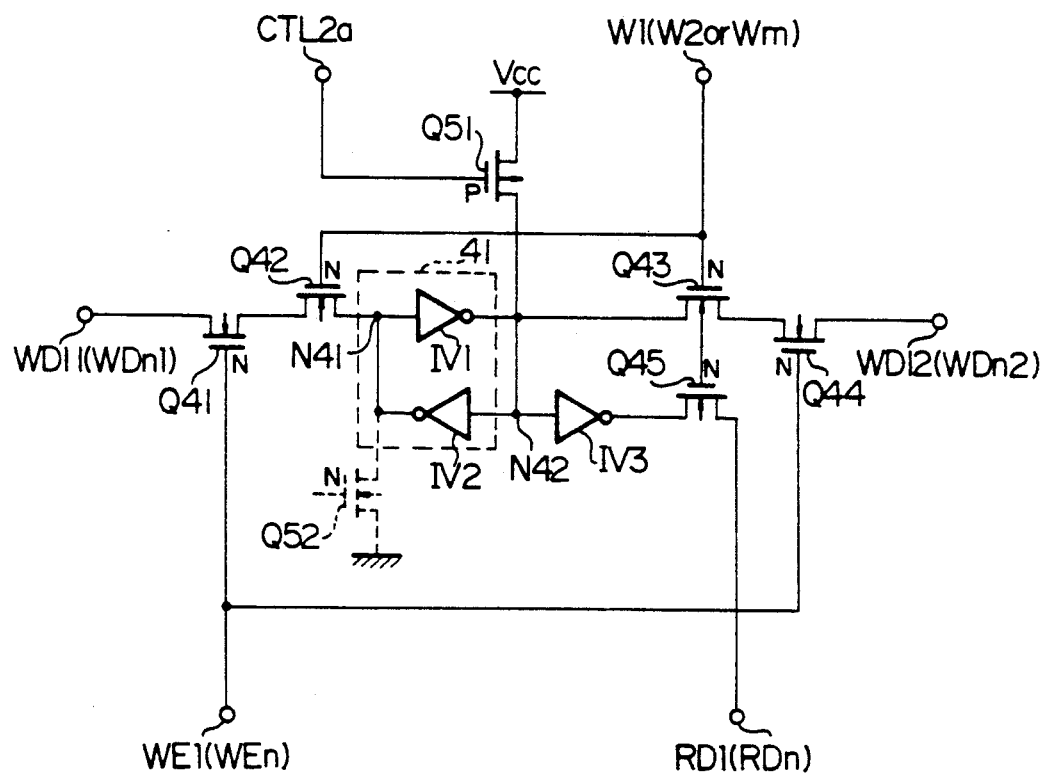
F I G. 5

SEMICONDUCTOR MEMORY DEVICE HAVING CONCURRENTLY RESETTABLE MEMORY CELLS

FIELD OF THE INVENTION

This invention relates to a semiconductor memory device and, more particularly, to a circuit arrangement of a random access memory cell incorporated in the semiconductor memory device.

DESCRIPTION OF THE RELATED ART

A typical example of a random access memory device is illustrated in FIG. 1 and, a plurality of memory cells M11, M1n, M21, M2n, Mm1 and Mmn are arranged in matrix. Word lines W1, W2 and Wm are respectively coupled to the rows of the memory cells M11 to Mmn, and an address decoder circuit 1 shifts one of the word lines W1 to Wm to an active high voltage level on the basis of address bits supplied to address signal terminals ADD. A pair of write-in data lines WD11 and WD12 or WDn1 and WDn2, a write-in mode signal line WE1 or WEn and a read-out data line RD1 or RDn are further associated with the columns of the memory cells M11 to Mmn, and the memory cells M11 to Mmn selectively enter a write-in mode of operation and a read-out mode of operation under the control of write-in controlling circuits 2. Namely, if a write-in enable signal of an active low voltage level is supplied from an external device to a write-in enable terminal WE, the write-in controlling circuits 2 shift the write-in mode signal lines WE1 to WEn to an active high voltage level, and data bits at input data terminals DI1 to DIn are produced into input data signals on the write-in data lines WD11 to WDn1 and the complementary signals on the write-in data lines WD12 to WDn2 by input data buffer circuits 3. The data bits thus supplied on the write-in data lines WD11 to WDn2 are written into a row of the memory cells activated by one of the word lines. If, on the other hand, the write-in enable signal WE is shifted to an inactive high voltage level, the write-in controlling circuits 2 allow the write-in mod signal lines WE1 to WEn from the active high voltage level to an inactive low voltage level, and data bits are read out from the memory cells coupled to one of the word lines W1 to Wm activated to the read-out data lines RD1 to RDn. The data bits thus read out on the read-out data lines RD1 to RDn are transferred to output data buffer circuits 4, and the output data buffer circuits 4 supply the data bits to output data terminals DO to DOn. Thus, the memory cells M11 to Mmn selectively enter the write-in mode of operation and the read-out mode of operation.

All of the memory cells M11 to Mmn are similar in arrangement to one another, and the circuit arrangement of the memory cell M11 is, by way of example, described with reference to FIG. 2. A data bit is stored in a memory loop consisting of two inverter circuits IV1 and IV2, and two series combinations of switching transistors QN1, QN2, QN3 and QN4 are respectively coupled between the memory loop and the write-in data lines WD11 and WD12. The switching transistors QN1 and QN4 are concurrently gated by the write-in mode signal line WE1, and the switching transistors QN2 and QN3 are shifted between on-state and off-state by the word line W1. A series combination of an inverter circuit IV3 and a switching transistor QN5 is coupled between the memory loop and the read-out data line RD1, and the switching transistor QN5 is gated by the word line W1.

If the write-in mode signal line WE1 remains in the inactive low voltage level indicative of the read-out mode of operation, the switching transistors QN1 and QN4 are turned off, and the memory loop is blocked from the write-in data lines WD11 and WD12 in the presence of the word line W1 to be shifted to the active high voltage level. Even though the switching transistors QN1 and QN4 are turned off, the word line W1 in the active high voltage level allows the switching transistor QN5 to turn on, and a data bit memorized in the memory loop is transferred to the read-out data line RD1. If the write-in mode signal line WE1 goes up to the active high voltage level, the switching transistors QN1 and QN4 turn on. When the word line W1 to be activated also causes the switching transistors QN2 and QN3 to turn on, then an input data signal and the complementary signal thereof on the write-in data lines WD11 and WD12 are conducted through the switching transistors QN1 to QN4 to the memory loop, and an input data bit represented by the input data signal and the complementary signal thereof is memorized in the memory loop.

The semiconductor memory device shown in FIG. 1 further enters a reset mode of operation, and a reset controlling circuit 5 is incorporated in the circuit. The reset controlling circuit 5 is responsive to a reset controlling signal of the active low voltage level at a reset terminal CLR and produces two controlling signals fed through controlling signal lines CTL1 and CTL2. The controlling signal line CTL1 is coupled to the write-in controlling circuits 2 as well as the input data buffer circuits 3, and the control signal line CTL2 to the address decoder circuit 1. Assuming now that the reset controlling signal shifted to the active low voltage level, the reset controlling circuit 5 supplies the controlling signals to the controlling signal lines CTL1 and CTL2, and the address decoder circuit 1 concurrently shifts all of the word lines W1 to Wm to the active high voltage level regardless of the address bits at the address terminals ADD in the presence of the controlling signal on the signal line CTL2. While all of the word lines W1 to Wm remain in the active high voltage level, the switching transistors QN2 and QN3 of all the memory cells M11 to Mmn turn on. With the controlling signal on the signal line CTL1, the write-in controlling circuits 2 shift all of the write-in mode signal lines WE1 to WEn to the active high voltage level, and, accordingly, the switching transistors QN1 and QN4 of all the memory cells M11 to Mmn turn on, thereby providing data paths between the memory loops of the cells M11 to Mmn and the associated write-in data lines WD11, WD12, WDn1 and WDn2, respectively. The input data buffer circuits 3 concurrently supplies reset data signals of either logic "1" or "0" level and the complementary signal thereof to the write-in data lines WD11 to WDn2 regardless of input data bits at the input data terminals DI1 to DIn. The reset data signals are, then, supplied through the switching transistors Q1 to Q4 to the memory loops of all the memory cells M11 to Mmn, and all of the memory cells M11 to Mmn are reset to the predetermined logic level. Upon completion of the reset mode of operation, the address decoder circuit 1, the write-in controlling circuits 2 and the input data buffer circuits 3 return to the previous states, and the semiconductor memory device can enter either write-in or read-out mode of operation.

Problems are encountered in the prior art semiconductor memory device in that the reset mode of operation consumes long time period and that the input data buffer circuits 3 sometimes fail to provide the reset data bits to all of the memory cells associated therewith. This is because of the fact that the input data buffer circuits 3 are small in current driving capability. The small current driving capability is reasonable from the aspect of the occupation area of the input data buffer circuits 3, because each of the input data buffer circuits 3 merely drives the associated write-in data line for one of the memory cells coupled thereto in the write-in mode of operation. However, such a small current driving capability is not enough to drive the associated write-in data line for all of the memory cells coupled thereto, and the problems become serious upon increasing the number of component memory cells.

SUMMARY OF THE INVENTION

It is therefore an important object of the present invention to provide a semiconductor memory device the memory cells of which can be surely reset without failure.

To accomplish these objects, the present invention proposes to provide a switching transistor between a memory circuit of each memory cell and a constant voltage source producing a reset level.

In accordance with the present invention, there is provided a semiconductor memory device comprising: a) a memory cell array having a plurality of memory cells arranged in rows and columns and having respective memory circuits for storing data bits each being of either first or second logic level in a rewritable manner; b) a read-out unit operative to selectively read out the data bits from the memory cells; c) a write-in unit operative to selectively write data bits into the memory cells; and d) a resetting unit operative to concurrently write resetting data bits into said memory cells and having a plurality of resetting circuits respectively coupled to the memory circuits, the resetting unit being responsive to an external reset controlling signal for causing the resetting circuits to concurrently supply said resetting data bits.

BRIEF DESCRIPTION OF THE DRAWINGS

The features and advantages of a semiconductor memory device according to the present invention will be more clearly understood from the following description taken in conjunction with the accompanying drawings in which:

FIG. 5 is a circuit diagram showing the arrangement of another memory cell associated with a single switching transistor;

DESCRIPTION OF THE PREFERRED EMBODIMENTS

First Embodiment

Figure 1:
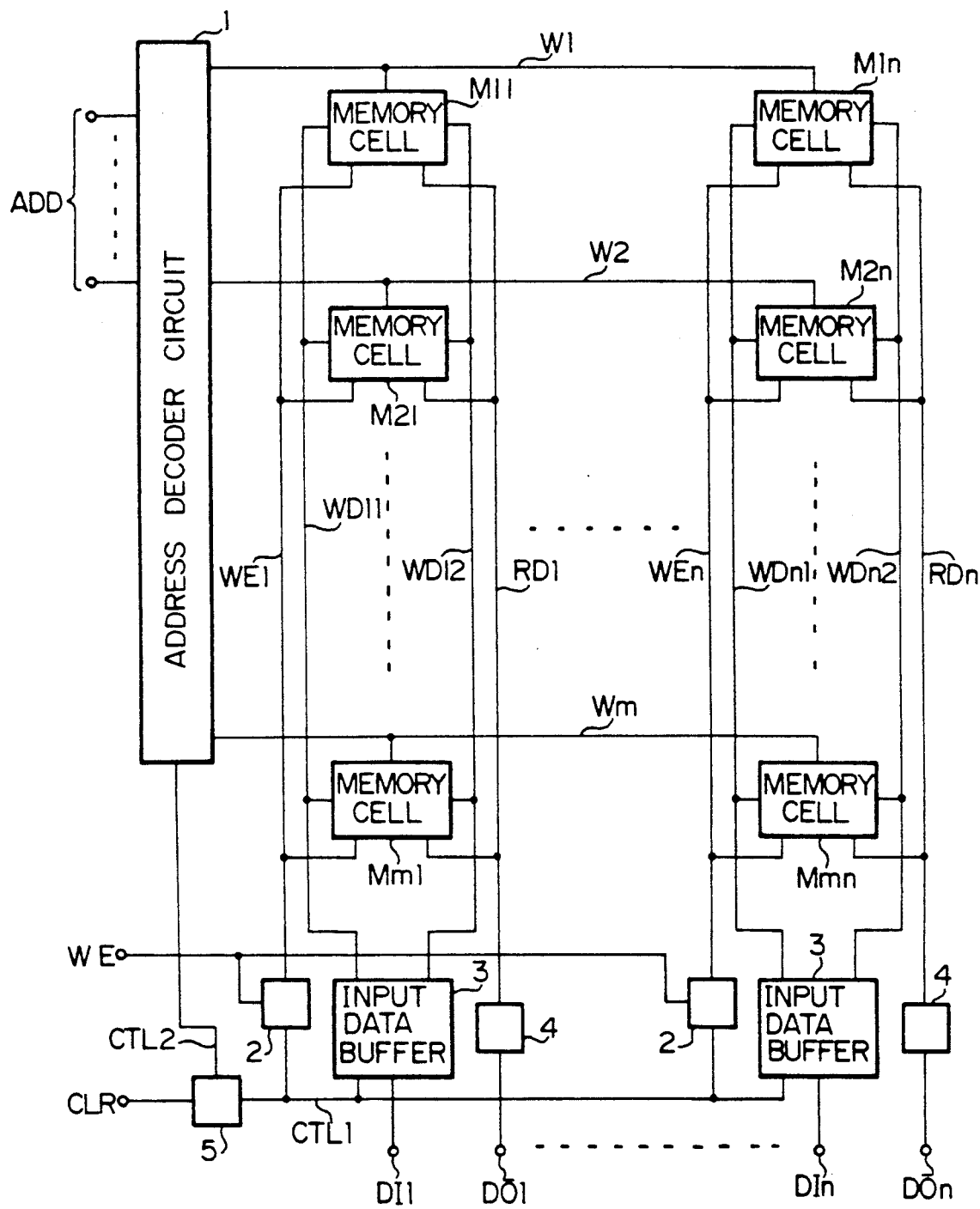
FIG. 1 is a block diagram showing the circuit arrangement of the prior art semiconductor memory device.
Figure 2:
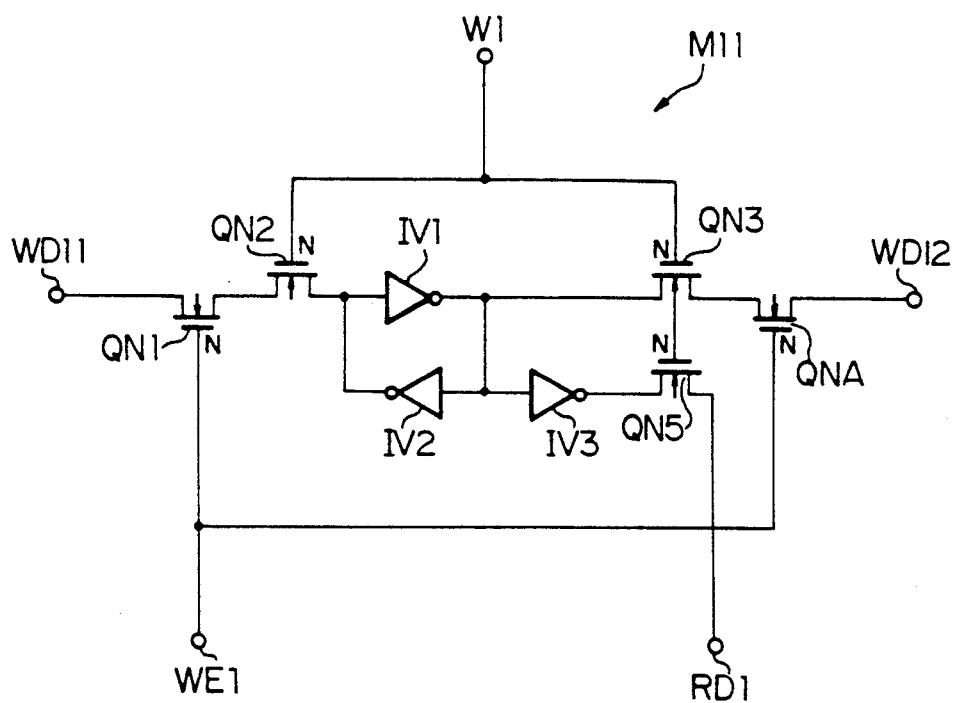
FIG. 2 is a circuit diagram showing the arrangement of each memory cell incorporated in the prior art semiconductor memory device.
Figure 3:
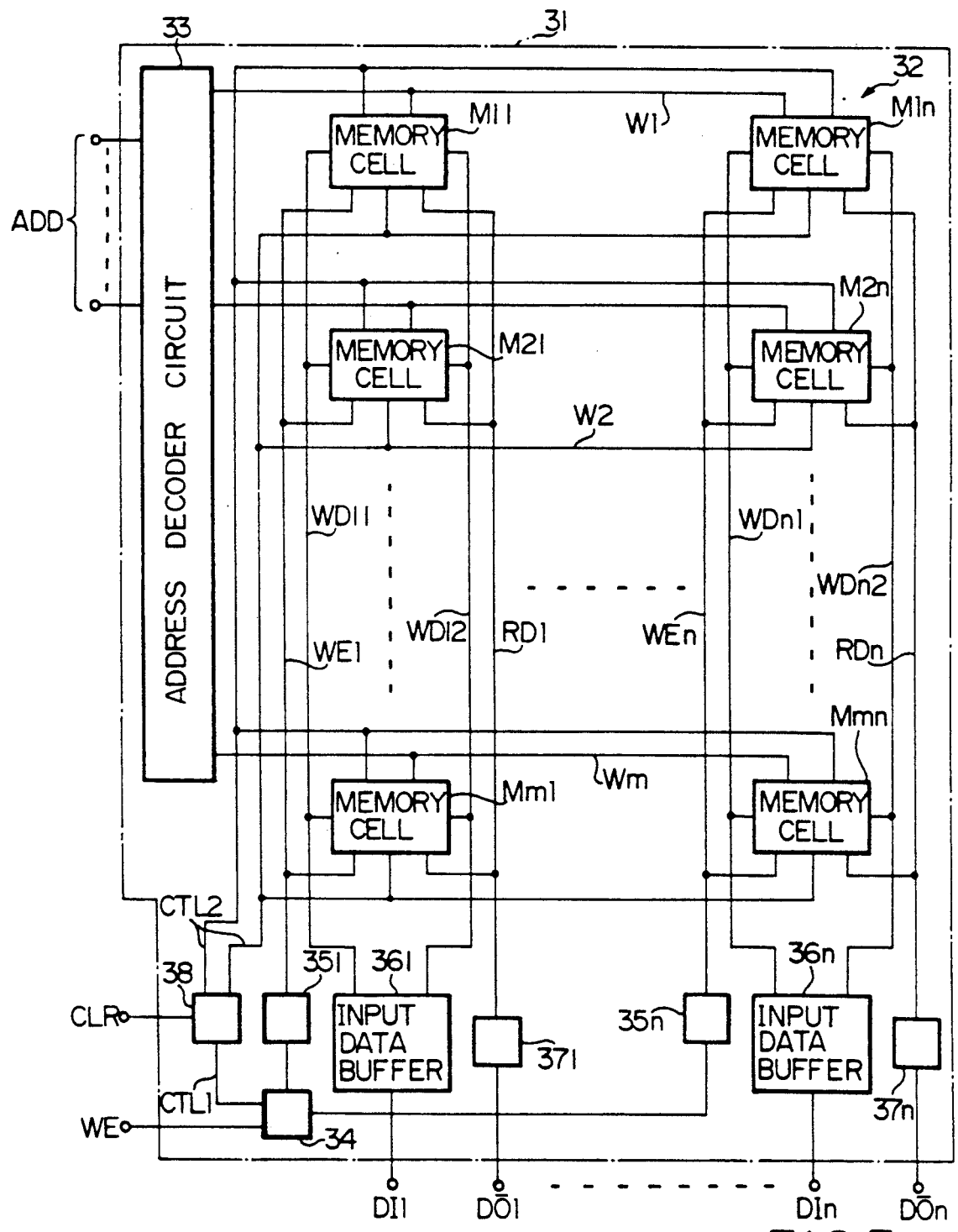
FIG. 3 is a block diagram showing the arrangement of a static random access memory device according to the present invention.

Referring first to FIG. 3 of the drawings, a static random access memory device is fabricated on a semiconductor substrate and has a memory cell array 32. Although the memory cell array 32 is constituted by a large number of memory cells arranged in rows and columns, only six memory cells M11, M1n, M21, M2n, Mm1 and Mmn are shown in FIG. 3 for the sake of simplicity. The static random access memory device selectively enters a write-in mode, a read-out mode and a reset mode of operation. Namely, the static random access memory device enters the write-in mode of operation in the presence of a write enable signal of an active low voltage level supplied to a write enable terminal WE. While the write enable terminal WE remain in an inactive high voltage level, the static random access memory device is accessible in the read-out mode of operation. A reset signal at a reset terminal CLR causes the static random access memory device to enter the reset mode of operation, and all of the memory cells are reset to a predetermined reset level. In this instance, the predetermined set level is equivalent to a data bit of logic "0" level read out from each memory cell The rows of the memory cells M11 to Mmn are respectively coupled to word lines W1, W2 and Wm, and an address decoder circuit 33 drives one of the word lines W1 to Wm on the basis of address bits supplied to address terminals ADD in the write-in mode and the read-out mode of operation. When one of the word lines W1 to Wm is driven to an active high voltage level, the memory cells coupled to the word line at the active high voltage level are concurrently activated so that data bits are written into or read out from the activated memory cells.

A plurality of first write-in data line pairs are coupled to the columns of the memory cells M11 to Mmn, and each of the write-in data line pairs is constituted by a first write-in data line WD11 or WDn1 paired with a second write-in data line WD12 or WDn2. The columns of the memory cells M11 to Mmn are further coupled to a plurality of write-in mode signal lines WE1 to WEn, and a write-in controlling circuit 34 causes a plurality of buffer circuits 351 to 35n to shift the write-in mode signal lines WE1 to WEn to an active high voltage level. While the write-in mode signal lines WE1 to WEn stay in the active high voltage level, the memory cells M11 to Mmn are in the write-in mode of operation. However, if the write-in mode signal lines WE1 to WEn are recovered to an inactive low voltage level, the memory cells M11 to Mmn are shifted to the read-out mode of operation. Additionally, the write-in mode of operation and the read-out mode of operation are established in the absence of the reset signal. A plurality of input buffer circuits 361 to 36n are respectively coupled between input data terminals DI1 to DIn and the write-in data line pairs, and each of the input buffer circuits 361 to 36n selectively drives either first or second write-in data line of the associated pair to a high voltage level. If one of the first and second write-in data lines goes up to the high voltage level, the other write-in data line remains in the low voltage level. In this instance, the write-in controlling circuit 34, the buffer circuits 351 to 35n and the input data buffer circuits 361 to 36n as a whole constitute a write-in unit.

The columns of the memory cells M11 to Mmn are further coupled to a plurality of read-out data lines RD1 to RDn, respectively, and output data buffer circuits 371 to 37n are inserted between the read-out data lines RD1 to RDn and output data terminals DO1 to DOn. When data bits are read out from the memory cells coupled to one of the word lines W1 to Wm in the active high voltage level, the data bits are temporarily stored in the output data buffer circuits 371 to 37n and, then, transferred to the output data terminals DO1 to DOn. In this instance, the output data buffer circuits 371 to 37n form in combination a read-out unit.

A reset controlling circuit 38 is responsive to the reset signal of the active low voltage level supplied to the reset terminal CLR and produces a first controlling signal on a first controlling signal line CTL1 and a second controlling signal of an active low voltage level and the complementary signal thereof on a second controlling signal line pair CTL2. The first controlling signal makes the write-in controlling circuit 34 inactive, and all of the write-in mode signal lines WE1 to WEn forcibly go down to the inactive low voltage level. On the other hand, the second controlling signal and the complementary signal thereof reset the memory cells M11 to Mmn as described hereinbelow in detail.

Each of the memory cells M11 to Mmn has a memory circuit 41 implemented by a loop of first and second inverter circuits IV1 and IV2, and input nodes of the first and second inverter circuits IV1 and IV2 serve as first and second memory nodes N41 and N42. A first series combination of first and second switching transistors Q41 and Q42 is coupled between the first memory node N41 and the associated first write-in data line WD11 or WDn1, and a second series combination of third and fourth switching transistors Q43 and Q44 is coupled between the second memory node N42 and the associated second write-in data line WD12 or WDn2. Each memory cell further has a third series combination of a third inverter circuit IV3 and a fifth switching transistor Q45 coupled between the second memory node N42 and the associated read-out data line RD1 or RDn. All of the switching transistors Q41 to Q45 incorporated in each memory cell are of an enhancement-mode n-channel type field effect transistor. The gate electrodes of the first and fourth switching transistors Q41 and Q44 are coupled to the associated write-in mode signal line WE1 or WEn, and the associated word line W1, W2 or Wm is coupled to the gate electrodes of the second, third and fifth switching transistors Q42, Q43 and Q45. When the write-in mode signal line WE1 or WEn and the word line W1, W2 or Wm are shifted to the active high voltage level, the memory circuit 41 is conducted to the associated write-in data line pair, and, accordingly, a new data bit in the form of the input signals complementarily shifted is memorized in the memory circuit 41. However, if only the word line W1, W2 or Wm is shifted to the active high voltage level, the data bit is read out from the memory circuit 41 through the third series combination to the associated read-out data line RD1 or RDn.

The memory cell thus arranged is associated with sixth and seventh switching transistors Q46 and Q47 which are respectively coupled between the first and second memory nodes N41 and N42 and first and second sources of voltage level. The first source of voltage level produces a positive voltage level Vcc, and the second source of voltage level supplies the seventh switching transistor Q47 with a ground voltage level. In this instance, the sixth switching transistor Q46 is of an enhancement mode p-channel type field effect transistor, and the seventh switching transistor Q47 is implemented by the enhancement-mode n-channel type field effect transistor. As described hereinbefore, the reset controlling circuit 38 produces the second control signal of the active low voltage level and the complementary signal thereof and supplies these signals on the second controlling line pair CTL2 in the presence of the reset signal of the active low voltage level. The second controlling signal is propagated by a first line CTL2a of the controlling signal line pair CTL2, and a second line CTL2b propagates the complementary signal. The sixth and seventh switching transistors Q46 and Q47 are gated by the first and second lines CTLa and CTLb and allow the first and second memory nodes N41 and N42 to have the ground voltage level and the positive voltage level Vcc, respectively. The positive voltage level Vcc at the second memory node N42 is inverted to the ground voltage level by the third inverter circuit IV3, and the ground voltage level is equivalent to logic "0" level. When the memory nodes N41 and N42 are shifted to the ground voltage level and the positive voltage level Vcc, the second controlling signal is recovered to the inactive high voltage level, and, accordingly, the complementary signal thereof goes down to the inactive low voltage level. Then, the sixth and seventh switching transistors Q46 and Q47 turn off, and the reset level or logic "0" level is memorized in the memory circuit 41. In this instance, the sixth and seventh switching transistors Q46 and Q47 form in combination a resetting circuit and the reset controlling circuit 38 and the resetting circuits respectively associated with the memory cells M11 to Mmn as a whole constitute a resetting unit.

As will be understood from the foregoing description, the sixth and seventh switching transistors Q46 and Q47 provide the reset level to the associated memory cell and, accordingly, achieve a high speed reset mode of operation, because current is directly supplied to or discharged from the memory circuit 41 without passing through any long signal line. Since the first and fourth switching transistors Q41 and Q44 block the memory nodes N41 and N42 from the large amount of parasitic capacitance coupled to the write-in data signal line, the switching transistors Q46 and Q47 are small in size, and, accordingly, the resetting unit occupies a small amount of the real estate.

Each of the memory cells M11 to Mmn incorporated in the static random access memory device shown in FIG. 3 is associated with the sixth and seventh switching transistors Q46 and Q47. However, another static random access memory device has memory cells each associated with a sixth switching transistor Q51 coupled between the source of positive voltage level Vcc and the second memory node Q42 as shown in FIG. 5. No complementary signal of the second controlling signal is produced in the reset controlling circuit 38, and the circuit arrangement is simpler than the static random access memory device shown in FIG. 3. The positive voltage level Vcc supplied to the second memory node N42 is inverted to the ground voltage level by the third inverter circuit IV3, and the reset level memorized in each memory cell is equivalent to logic "0" level. The sixth switching transistor Q51 may be replaced with a seventh switching transistor Q52, and the reset controlling circuit 38 produces the second controlling signal of the active low voltage level for the seventh switching transistor Q52. In this instance either sixth or seventh switching transistor Q51 or Q52 serves as a resetting circuit.

Second Embodiment

Figure 4:
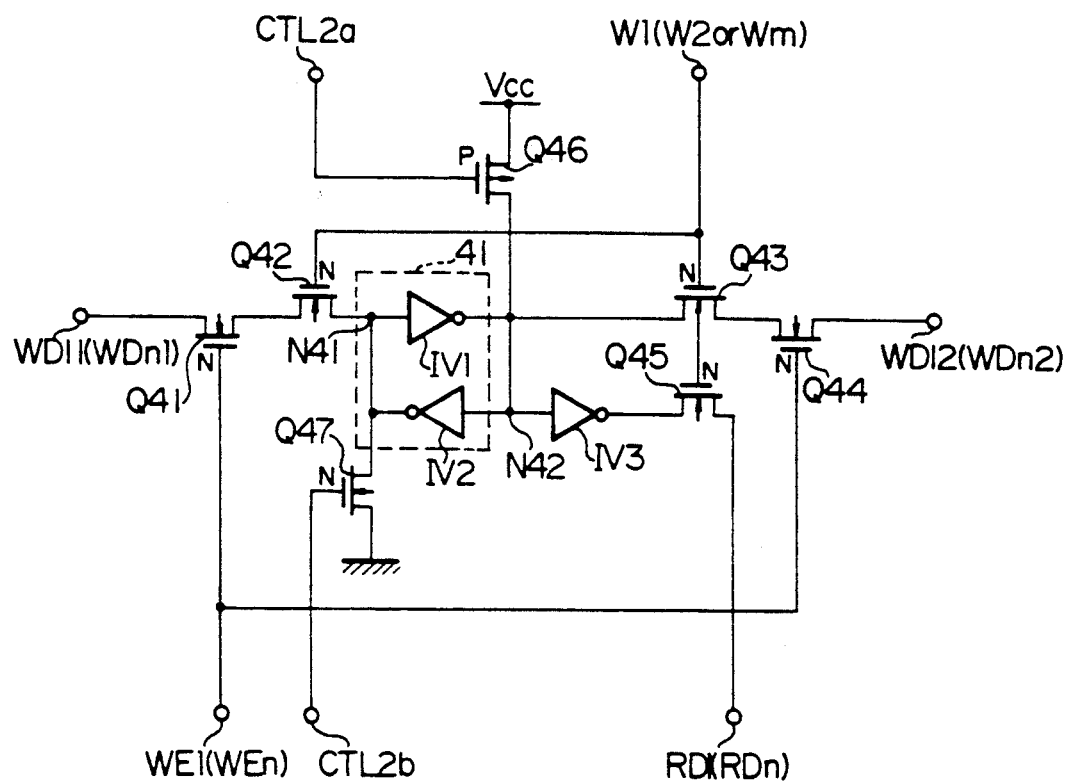
FIG. 4 is a circuit diagram showing the arrangement of each memory cell associated with switching transistors of a resetting unit incorporated in the static random access memory device shown in FIG. 3.
Figure 6:
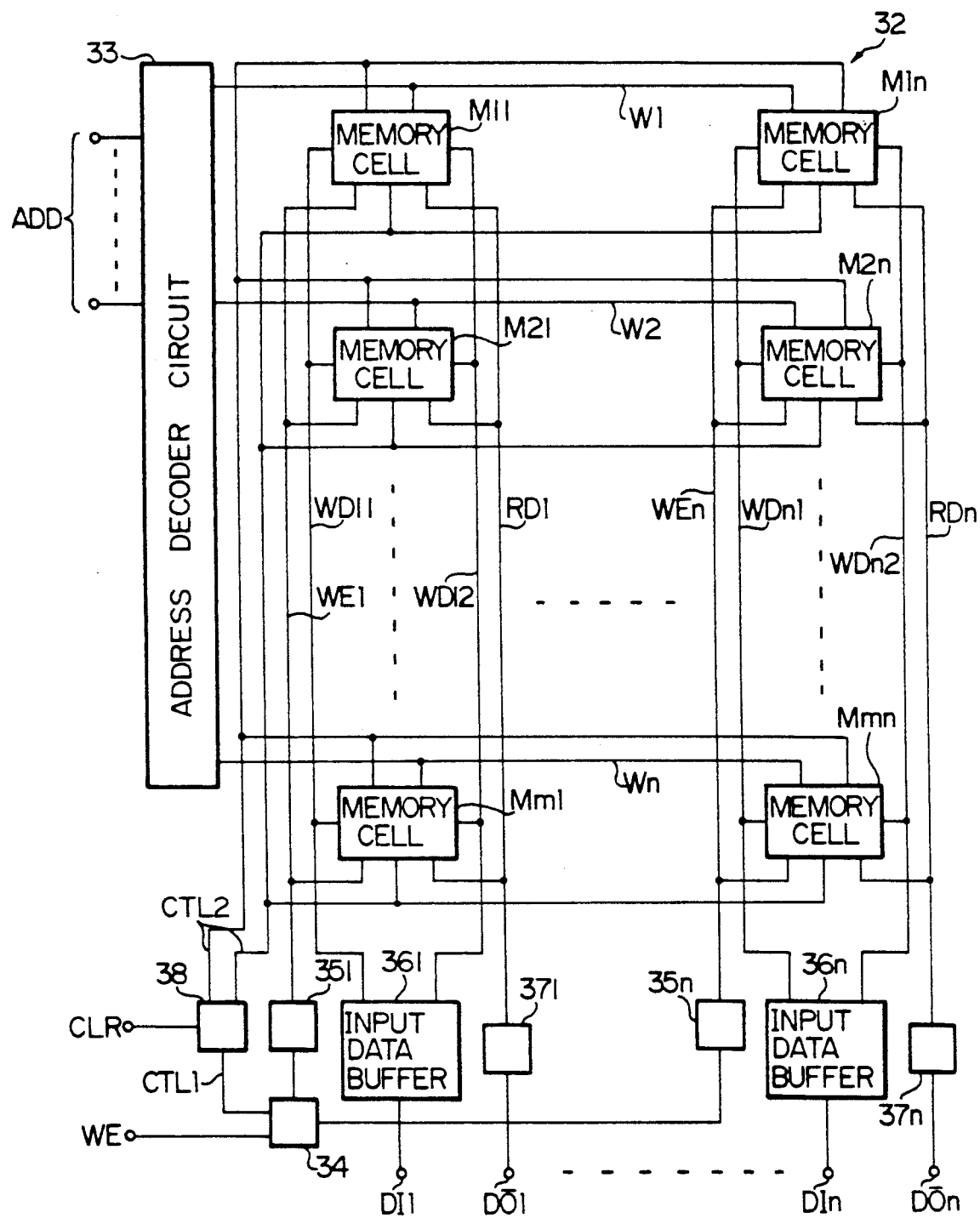
FIG. 6 is a block diagram showing the arrangement of another static random access memory device according to the present invention.
Figure 7:
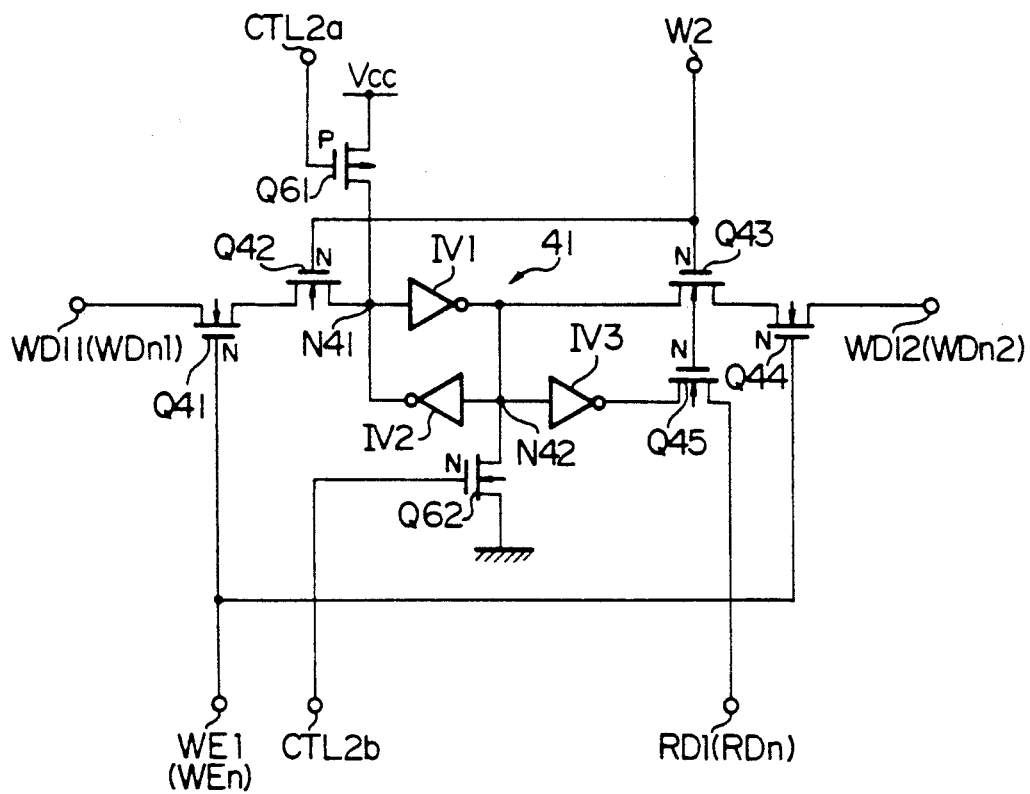
FIG. 7 is a circuit diagram showing the arrangement of a memory cell incorporated in the static random access memory device shown in FIG. 6.

Turning to FIG. 6 of the drawings, another static random access memory device embodying the present invention is illustrated. The static random access memory device shown in FIG. 6 is similar to that shown in FIG. 3 except for a resetting unit, and, for this reason, the corresponding circuits and transistors are designated by the same reference numerals and marks used in FIG. 3. The resetting unit comprises the reset controlling circuit 38 and two types of the resetting circuit. The first type of the resetting circuit is provided in association with a part of the memory cell array 32 such as, for example, the memory cells M11 to M1n and Mm1 to Mmn, and is similar in circuit arrangement to that shown in FIG. 4. The remaining part of the memory cell array 32, which includes the memory cells M21 to M2n, is accompanied with the second type of the resetting circuit illustrated in FIG. 7. The second types of the resetting circuit has an eighth switching transistor Q61 of the enhancement mode p-channel type coupled between the source of positive voltage level Vcc and the first memory node N41 and the ninth switching transistor of the enhancement mode n-channel type coupled between the second memory node N42 and the source of ground voltage level.

The write-in mode and the read-out mode of operation as well as the reset-mode of operation on the memory cells M11 to M1n and Mm1 to Mmn ar similar to those of the first embodiment, and, therefore, no description is incorporated hereinbelow. The reset-mode of operation on the memory cells M21 to M2n is different from that on the other memory cells. Namely, if the second reset controlling signal goes down to the active low voltage level and, accordingly, the complementary signal goes up to the high voltage level, the eighth and ninth switching transistors Q61 and Q62 concurrently turn on to provide current path between the first and second memory nodes N41 and N42 and the positive and ground voltage sources. Then, the first memory node N41 is charged to the positive voltage level Vcc, and the second memory node N42 is discharged to the ground voltage level. The ground voltage level at the second memory node N42 is inverted to the positive voltage level Vcc by the third inverter circuit IV3, and a predetermined reset level is equivalent to logic "1" level for the memory cells M21 to M2n. By virtue of the first and second types of the resetting circuit, two kinds of bit string, i.e. (000 ... 0) and (111 ... 1), are produced in the memory cell array 32 upon completion of the reset mode of operation.

Third Embodiment

Figure 8:
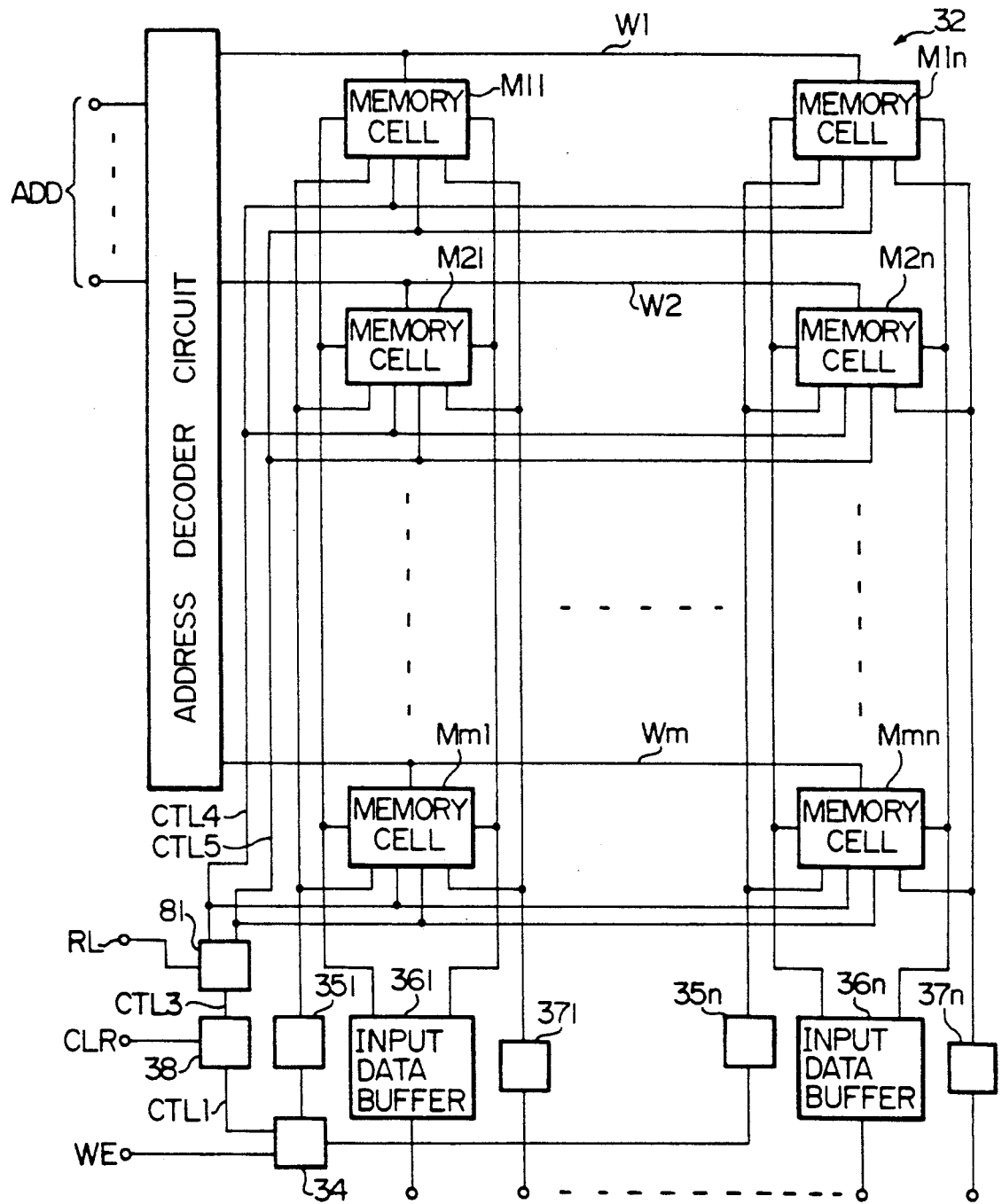
FIG. 8 is a bock diagram showing the circuit arrangement of still another static random access memory device according to the present invention.

Turning to FIG. 8 of the drawings, a static random access memory device embodying the present invention is characterized by a resetting unit providing reset level of either logic "1"or "0"level to each of the memory cells M11 to Mmn. The other component circuits and transistors are designated by the same reference numerals and marks used in FIGS. 3 and 4 without any detailed description.

The resetting unit comprises the reset controlling circuit 38 responsive to the reset signal of the active low voltage level, and the reset controlling circuit 38 produces the first reset controlling signal fed to the write controlling circuit 34 and a third controlling signal CTL3 fed to a switching circuit 81. In this instance, the third controlling signal CTL3 serves as an activation signal. With the third controlling signal CTL3, the switching circuit 81 is activated to respond to a reset level signal indicative of a reset level of either logic "1"or "0"level If the reset level signal indicative of logic "1"level is supplied to a terminal RL, the switching circuit 81 drives the fourth controlling signal line CTL4 to an active high voltage level. However, the switching circuit 81 drives a fifth controlling signal line CTL5 to an active high voltage level in the co-presence of the third controlling signal CTL3 and the reset level signal indicative of logic "0"level. Thus, the switching circuit 81 drives one of the fourth and fifth controlling signal lines CTL4 and CTL5 depending upon the reset level signal at the terminal RL.

The resetting unit further comprises a plurality of resetting circuits respectively associated with the memory cells M11 to Mmn, and each of the resetting circuits has a tenth switching transistor Q91 coupled between the first memory node N41 and the source of the ground voltage level and an eleventh switching transistor Q92 coupled between the second memory node N42 and the source of ground voltage level. In this instance, both of the tenth and eleventh switching transistors Q91 and Q92 are of the enhancement mode n-channel type field effect transistor.

Figure 9:
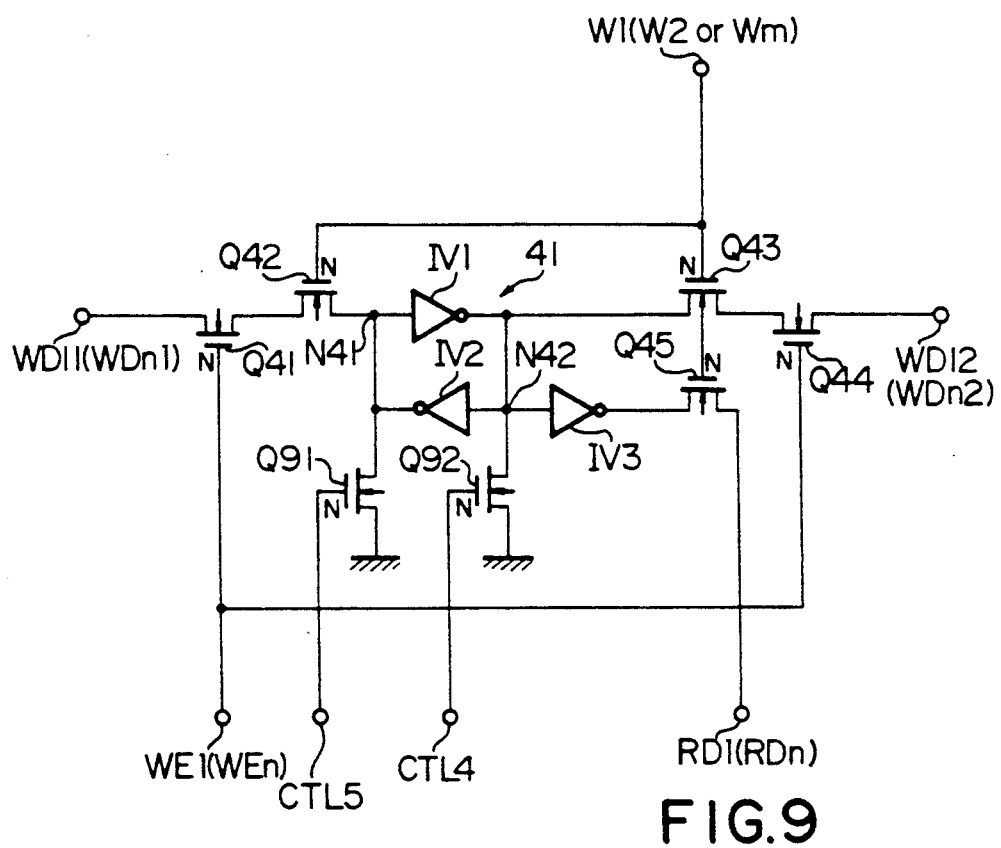
FIG. 9 is a circuit diagram showing the arrangement of a memory cell incorporated in the static random access memory device shown in FIG. 8.

Since either fourth or fifth controlling signal line CTL4 or CTL5 is shifted to the active high voltage level, the eleventh or tenth switching transistor Q92 o Q91 turns on to provide a current path between the second or first memory node N42 or N41 and the source of the ground voltage level. If the first memory node N41 is grounded, the memory circuit 41 stores the reset level equivalent to logic "0"level. However, the ground voltage level at the second memory node N42 results in the reset level equivalent to logic "1"level. Thus, the resetting unit incorporated in the static random access memory device shown in FIG. 9 allows the memory cells M11 to Mmn to be reset to either logic "1"or "0"level depending upon the reset level signal.

Although particular embodiments of the present invention have been shown and described, it will be obvious to those skilled in the art that various changes and modifications may be made without departing from the spirit and scope of the present invention. For example, the memory loop is implemented by two inverter circuit, and each inverter circuit may be formed by a series combination of a p-channel type field effect transistor and an n-channel type field effect transistor with the gate electrodes coupled to the common drain node of the other series combination. However, another memory circuit of a random access type may be used in another semiconductor memory device. Moreover, the semiconductor memory device according to the present invention per se forms an integrated circuit. However, the present invention may appertain to a memory cell unit integrated together with other electric and/or electronic circuits. The component n-channel type field effect transistors and the component p-channel type field effect transistors may be replaced with p-channel type field effect transistors and n-channel type field effect transistors, respectively.

What is claimed is:

1. A semiconductor memory device comprising:
   a) a memory cell array having a plurality of static random access memory cells arranged in rows and columns and storing data bits each being of either first or second logic level in a rewritable manner, each of said memory cells including a storage circuit with first and second memory nodes, and first series combination of first and second switching transistors coupled between a first write-in node and said first memory node, a second series combination of third and fourth switching transistors coupled between a second write-in node and said second memory node, and a third series combination of an inverter circuit and a fifth switching transistor coupled between said second memory node and a read-out node, an input data signal and a complementary signal of the input data signal being supplied to said first and second write-in nodes, respectively;
   b) a read-out unit operative to selectively read out said data bits from said memory cells;
   c) a write-in unit operative to selectively write data bits into said memory cells; and
   d) a resetting unit operative to concurrently write resetting data bits into said memory cells and having a plurality of resetting circuits respectively coupled to said storage circuits, said resetting unit being responsive to an external reset controlling signal for causing said resetting circuits to concurrently supply said resetting data bits, said resetting unit further having a reset controlling circuit responsive to a reset signal indicative of said reset-mode of operation for driving a controlling signal line and another controlling signal line complementary to said controlling signal line, each of said resetting circuits having a sixth switching transistor of one channel conductivity type coupled between said second memory node and a source of first voltage level and gated by said controlling signal line, and a seventh switching transistor of the opposite channel conductivity type coupled between said first memory node and a source of second voltage level and gated by said another controlling signal line.

2. A semiconductor memory device comprising:
   a) a memory cell array having a plurality of static random access memory cells arranged in rows and columns and storing data bits each being of either first or second logic level in a rewritable manner, each of said memory cells including a storage circuit with first and second memory nodes, a first series combination of first and second switching transistors coupled between a first write-in node and said first memory node, a second series combination of third and fourth switching transistors coupled between a second write-in node and said second memory node, and a third series combination of an inverter circuit and a fifth switching transistor coupled between said second memory node and a read-out node, an input data signal and a complementary signal of the input data signal being supplied to said first and second write-in nodes, respectively;
   b) a read-out unit operative to selectively read out said data bits from said memory cells;
   c) a write-in unit operative to selectively write data bits into said memory cells; and
   d) a resetting unit operative to concurrently write resetting data bits into said memory cells and having a plurality of resetting circuits respectively coupled to said storage circuits, said resetting unit being responsive to an external reset controlling signal for causing said resetting circuits to concurrently supply said resetting data bits, said resetting unit further having a reset controlling circuit responsive to a reset signal indicative of said reset-mode of operation for driving a controlling signal line, and another controlling signal line complementary to said controlling signal line, said resetting circuits comprising first resetting circuits provided in association with a part of said memory cell array, each of said first resetting circuits having a sixth switching transistor of one channel conductivity type coupled between said second memory node and a source of first voltage level and gated by said controlling signal line, and a seventh switching transistor of the opposite channel conductivity type coupled between said first memory node and a source of second voltage level and gated by said another controlling signal line, said resetting circuits further comprising second resetting circuits provided in association with the remaining part of said memory cell array, each of said second resetting circuits having an eighth switching transistor of one channel conductivity type coupled between said first memory node and said source of first voltage level and gated by said controlling signal line, and a ninth switching transistor of the opposite channel conductivity type coupled between said second memory node and said source of second voltage level and gated by said another controlling signal line.

3. A semiconductor memory device comprising:
   a) a memory cell array having a plurality of static random access memory cells arranged in rows and columns and storing data bits each being of either first or second logic level in a rewritable manner, each of said memory cells including a storage circuit with first and second memory nodes, a first series combination of first and second switching transistors coupled between a first write-in node and said first memory node, a second series combination of third and fourth switching transistors coupled between a second write-in node and said second memory node, and a third series combination of an inverter circuit and a fifth switching transistor coupled between said second memory node and a read-out node, an input data signal and a complementary signal of the input data signal being supplied to said first and second write-in nodes, respectively;
   b) a read-out unit operative to selectively read out said data bits from said memory cells;
   c) a write-in unit operative to selectively write data bits into said memory cells; and d) a resetting unit operative to concurrently write resetting data bits into said memory cells and having a plurality of resetting circuits respectively coupled to said storage circuits, said resetting unit being responsive to an external reset controlling signal for causing said resetting circuits to concurrently supply said resetting data bits, said resetting unit further having a switching circuit responsive to a reset level signal indicative of a resetting level of either first or second logic level in the presence of an activation signal for driving one of two controlling signal lines to an active level, a reset controlling circuit responsive to a reset signal indicative of said reset-mode of operation for producing said activation signal, each of said resetting circuits having a sixth switching transistor coupled between said first memory node and a source of second voltage level and gated by one of said two controlling signal lines, and a seventh switching transistor coupled between said second memory node and said source of second voltage level and gated by the other of said two controlling lines.

4. A semiconductor memory device fabricated on a semiconductor substrate and having a write-in mode of operation, a read-out mode of operation of a reset mode of operation, comprising:
   a) a plurality of memory cells arranged in row and columns, each of said memory cells having a memory loop constituted by first and second inverter circuit for storing a data bit of either logic "1" or "0" level, a series combination of first and second switching transistors coupled between the input node of said first inverter circuit and a first data write-in node, a second series combination of third and fourth switching transistors coupled between the input node of said second inverter circuit and a second write-in node, a third series combination of a third inverter circuit and a fifth switching transistor coupled between the input node of said second inverter circuit and a read-out node;
   b) a plurality of word lines associated with the rows of said memory cells, respectively, each of aid word lines being coupled to gate electrodes of said second, third and fifth switching transistors of each memory cell in the associated row;
   c) a plurality of first write-in data lines respectively paired with second write-in data lines for forming a plurality of write-in data line pairs respectively provided in association with the columns of said memory cells, each of said first write-in data lines and each second write-in data line paired therewith being respectively coupled to said first and second write-in nodes of each memory cell in the associated column;
   d) a plurality of write-in mode signal lines respectively associated with the columns of said memory cells, each of said write-in mode signal lines being coupled to gate electrodes of said first and fourth switching transistors of each memory cell in the associated column;
   e) a plurality of read-out data lines respectively associated with the columns of said memory cells, each of said read-out data lines being coupled to said read-out node of each memory cell in the associated column;
   f) a plurality of resetting circuits respectively associated with said memory cells, each of said resetting circuits having a sixth switching transistor coupled between the input node of said second inverter circuit and a source of first voltage level, and a seventh switching transistor coupled between the input node of said first inverter circuit and a source of second voltage level;
   g) an address decoder circuit responsive to address bits fed from the outside thereof which shifts one of said word lines to an active level in said read-out and write-in modes of operation;
   h) a plurality of write-in mode controlling circuits respectively coupled to said write-in mode signal lines and responsive to a write-in enable signal indicative of said write-in mode of operation for shifting said write-in mode signal lines to an active level, said write-in mode signal lines remaining in an inactive level in the absence of said write-in enable signal;
   i) a plurality of input data buffer circuits respectively coupled to said write-in data line pairs, each of said input data buffer circuits being responsive to an input data bit for supplying an input data signal and the complementary signal thereof to said associated first and second write-in data lines, respectively;
   j) a plurality of output data buffer circuits respectively coupled to said read-out data lines for supplying output data bits to output data terminals, respectively; and
   k) a resetting unit responsive to a resetting signal fed from the outside thereof and operative to cause said sixth and seventh switching transistors of each memory cell to turn on and to maintain said write-in mode controlling circuits in an inactive state.

* * * * *

UNITED STATES PATENT AND TRADEMARK OFFICE
CERTIFICATE OF CORRECTION

PATENT NO. : 5,285,420

DATED : February 8, 1994

INVENTOR(S) : Yasuo SHIBUE

It is certified that error appears in the above-identified patent and that said Letters Patent is hereby corrected as shown below:

Column 8, line 45, delete "o" and insert --or--.

Signed and Sealed this

Ninth Day of August, 1994

Attest:

BRUCE LEHMAN

Attesting Officer

Commissioner of Patents and Trademarks